United States Patent [19]
Lupinski et al.

[11] Patent Number: 5,169,911
[45] Date of Patent: Dec. 8, 1992

[54] HEAT CURABLE BLENDS OF SILICONE POLYMIDE AND EPOXY RESIN

[75] Inventors: John H. Lupinski, Scotia; Thomas B. Gorczyca, Schenectady, both of N.Y.

[73] Assignee: General Electric Company, Schenectady, N.Y.

[21] Appl. No.: 836,493

[22] Filed: Feb. 18, 1992

[51] Int. Cl.$^5$ .................... C08F 283/00; C08G 59/14
[52] U.S. Cl. ................................. 525/523; 524/188; 528/26; 528/38
[58] Field of Search ..................... 525/523; 524/188; 528/26, 38

[56] References Cited

U.S. PATENT DOCUMENTS

| | | | |
|---|---|---|---|
| 4,497,728 | 2/1985 | Yoshimura et al. | 528/481 |
| 4,598,135 | 7/1986 | Buese | 528/23 |
| 4,826,916 | 5/1989 | Policastro et al. | 524/755 |
| 5,064,882 | 11/1991 | Walles et al. | 523/433 |

Primary Examiner—Morton Foelak
Attorney, Agent, or Firm—William A. Teoli

[57] ABSTRACT

Heat curable dielectric compositions are provided comprising blends of silicone polyimide and epoxy resin and an effective amount of an arylonium salt such as a diaryliodoniumhexafluoroantimonate in combination with a free radical generating aromatic compound as a cocatalyst.

5 Claims, No Drawings

HEAT CURABLE BLENDS OF SILICONE POLYIMIDE AND EPOXY RESIN

CROSS REFERENCE TO RELATED APPLICATION

Reference is made to copending application, Ser. No. 07/646,112, filed Jan. 1, 1991, for Epoxy/Polyimide Copolymer Blend Dielectric and Layered Circuits Incorporating It.

Background of the Invention

The present invention relates to a heat curable dielectric material in the form of a blend of a silicone polyimide, an epoxy resin and an arylonium salt where the heat curable dielectric material is suitable for use in the formation of multilayer conductive structures. More particularly, the present invention relates to the employment of a free radical generating aromatic compound, such as benzopinacol, as a cocatalyst for an arylonium salt used in a heat curable blend of a silicone polyimide and an epoxy resin.

Prior to the present invention, as shown by copending application Ser. No. 07/646,112, dielectric materials were provided in the form of a heat curable blend of an epoxy resin, a solution of a silicone polyimide, a diaryliodonium catalyst, such as a diaryliodonium hexafluoroantimonate salt and an aliphatic hydrocarbon oil solution of copper naphthenate as a cocatalyst. Although the heat curable blends provide cured dielectric materials having a low leakage and a low dielectric constant (3.3-3.9), experience has shown that the heat curable blends can vary considerably in shelf stability. An attempt to improve the shelf life of the heat curable blends by reducing the level of the copper naphthenate cocatalyst resulted in a heat curable material having a reduced cure rate. In addition, a large amount of epoxy resin which does not crosslink is lost during the thermal cure. An attempt to accelerate the cure rate by increasing the concentration of the diaryliodonium/copper naphthenate cocatalyst system containing the aliphatic hydrocarbon solvent often resulted in an undesirable build-up of the aliphatic oil solvent and a reduction in the shelf-life of the curable blend.

It would be desirable therefore to provide heat curable blends of silicone polyimide and epoxy resin having at least a six month shelf-life which are useful as dielectric materials suitable for use in the formation of multilayer conductor structures. It also would be desirable to provide heat curable dielectric materials having compatible components which did not suffer from excessive component weight loss during cure.

SUMMARY OF THE INVENTION

The present invention is based on the discovery that a free radical generating aromatic compound, such as benzopinacol, can be employed in combination with an arylonium catalyst, defined hereinafter such as a diaryliodonium hexafluoroantimonate catalyst, to serve as a cocatalyst in blends of the polyimidesiloxane and epoxy resin to provide heat curable compositions useful as dielectric materials. The term "polyimide siloxane" can mean a material resulting from the intercondensation of an organic dianhydride, for example, 2,2-bis[4-(3,4-dicarboxyphenoxy)phenyl]-propane dianhydride (BPADA), with organic diamine, such as toluenediamine, aminoalkyl terminated polydimethylsiloxane, or oxydianiline in the presence of an organic solvent as shown in Poliscastro et al, U.S. Pat. No. 4,826,916 which is incorporated herein by reference. Arylonium salts or diaryliodonium hexafluoroantimonate salts or catalysts which are used in the present invention are also used in the heat curable compositions of Walles et al, U.S. Pat. No. 5,064,882 which is incorporated herein by reference. Surprisingly, the replacement of copper naphthenate with a free radical generating aromatic compound as a cocatalyst for the diaryliodonium hexafluoroantimonate salt has been found to provide heat curable dielectric materials having improved shelf stability, component compatibility, and a weight percent reduction in uncured epoxy resin which can be lost during the heat cure step of the polyimidesiloxane-epoxy blend.

STATEMENT OF THE INVENTION

There is provided by the present invention, a heat curable dielectric material useful in the formation of multilayer conductor structures comprising by weight,
(A) 100 parts of a silicone polyimide
(B) 10 to 150 parts of an epoxy resin,
(C) a catalytic amount of an arylonium salt, and
(D) an effective amount of a free radical generating aromatic compound as a cocatalyst for (C).

One method of making the silicone polyimide useful in the practice of the present invention is by effecting reaction in the presence of an organic solvent such as bis(2-methoxyethyl)ether(diglyme)/toluene, or methylanisole between particular aromatic dianhydrides and $C_{(6-14)}$ aryl diamine or a mixture thereof with aminoalkyl terminated polydiorganosiloxane. There can be used, aromatic bis(ether anhydride), for example 2,2-bis[4-(3,4-dicarboxyphenoxy)phenyl]propane dianhydride "BPADA", or phthalic anhydride terminated polydiorganosiloxane, such as bis(phthalic anhydride)-tetramethyldisiloxane "PADS". These aromatic dianhydrides can be reacted with $C_{(6-14)}$ aryldiamines, such as toluenediamine "TDA", or polydiorganosiloxane having terminal α-aminoalkyl diorganosiloxy units, such as tetramethyldisiloxane having terminal α-aminopropyl dimethylsiloxy units "DGAP", or where the methylsiloxane block has eight chemically combined dimethylsiloxy units, "D₈GAP".

Among the dianhydrides which can be used in the formation of the silicone polyimides useful in making the heat curable dielectric materials of the present invention are, for example, aromatic bis(ether anhydride) of the formula,

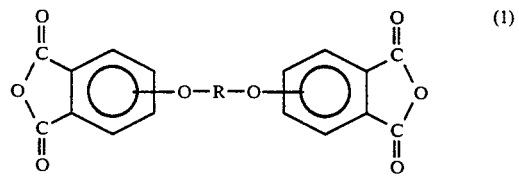

where R is a $C_{(6-14)}$ divalent aromatic radical selected from,

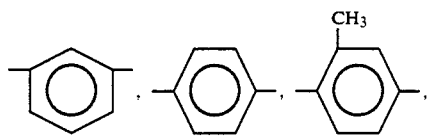

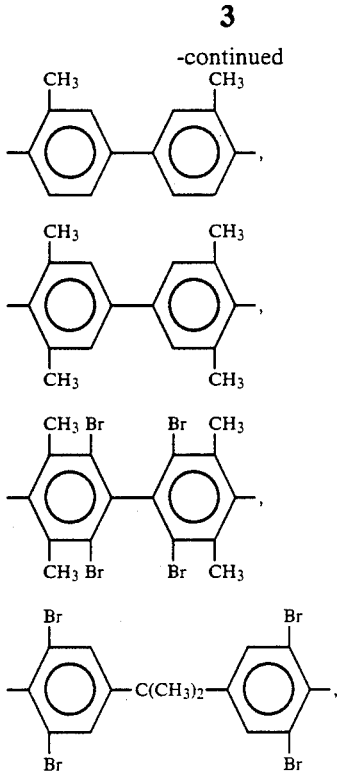

and divalent organic radicals of the general formula,

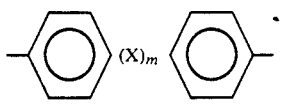

where X is a member selected from the class consisting of divalent radicals of the formulas, $$-C_yH_{2y}-, \quad -\overset{O}{\underset{\|}{C}}-, \quad -\overset{O}{\underset{\underset{\|}{O}}{\overset{\|}{S}}}-, \quad \text{and} \quad -S-,$$

where m is 0 or 1, and y is a whole number equal to from 1 to 5.

In addition to the above aromatic bis(ether anhydride), other dianhydrides which can be used in the practice of the invention are "siloxane dianhydrides" of the formula,

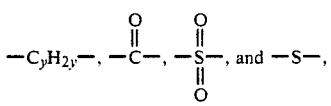

where $R^1$ is a $C_{(1-14)}$ monovalent hydrocarbon radical or a $C_{(1-14)}$ monovalent hydrocarbon radical substituted with monovalent radicals inert during condensation or equilibration, $R^2$ is a $C_{(6-14)}$ trivalent organic radical, and is preferably phthalic or norbornyl, and n is an integer equal to from 1 to 30 inclusive. Preferably, the siloxane dianhydride of formula (2) is bis-phthalic anhydride tetramethyldisiloxane, where n is 1, referred to hereinafter as "PADS". The siloxane dianhydride of formula (2) can be made by the procedure shown by J. R. Pratt et al., Journal of Organic Chemistry, Vol. 38, No. 25 (1973) pages 4271–4274. Reference to "PADS" also is made in copending application Ser. No. 011,185, filed Feb. 5, 1987, now U.S. Pat. No. 4,795,680000, and application Ser. No. 765,089 filed Aug. 13, 1985, now U.S. Pat. No. 4,709,054, assigned to the same assignee as the present invention and incorporated herein by reference.

The preferred aromatic bis(ether anhydride) utilized in the practice of the invention is 2,2-bis[4-3,4-dicarboxyphenoxy)phenyl]propane dianhydride "BPADA". Other organic dianhydrides which can be used are, for example, 5,5'-(1,1,3,3-tetramethyl 1-3-disiloxanebisnorbornane-2,3-dicarboxylic anhydride "DISiAN", shown by Ryang U.S. Pat. No. 4,381,396, oxybis(4-phthalic anhydride) "ODAN". As used hereinafter, the term "organic dianhydride" can include BPADA, DiSiAN, or ODAN, or a mixture thereof which can be used in combination with PADS at up to an equal molar amount. In addition, organic dianhydride also can include up to 10 mol percent, based on total moles of anhydride, of pyromellitic anhydride "PMDA", benzopheone dianhydride "BPDA", or 3,3', 4,4'-biphenyltetracarboxylic acid anhydride.

The preferred silicone polyimides of the present invention can be made by condensing BPADA, PADS or a mixture of PADS and organic dianhydride with amino-organo-terminated organosiloxane which can be used in further combination with organic diamine. Some of the amino-organo-terminated siloxane which can be used in the practice of the invention are shown by Lee U.S. Pat. No. 4,586,997. Preferably, there can be used an amino-terminated siloxane of the formula,

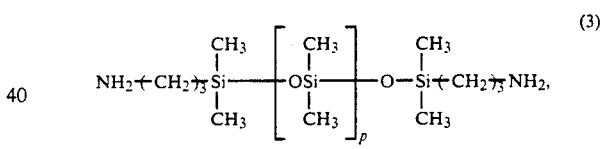 (3)

where p has a value of 0–8 inclusive, which includes DGAP, where p is equal to 1, and $D_8GAP$ where p is equal to 8. In addition to the amino-terminated siloxane of formula (3), there is also included in the practice of the present invention the use of various organic diamines or mixtures thereof, as previously defined, alone or in combination with the amino-terminated siloxane of formula (3). In addition to the amino-terminated siloxane of formula (3), there also can be utilized polydimethylsiloxane having from 0 to about 8 chemically combined dimethylsiloxy units and terminal aminophenyl units attached to silicon by carbon-silicon bonds.

The term "epoxy resin", as utilized in the description of the curable compositions of the present invention, includes any monomeric, dimeric or oligomeric or polymeric material having at least one epoxy group. For example, those resins resulting from the reaction of bisphenol A (4,4'-isopropylidenediphenol) and epichlorohydrin, or from the reaction of low molecular weight phenolformaldehyde resins (Novolak resins) with epichlorohydrin, can be used alone or in combination with an epoxy containing compound as a reactive diluent. Some of the diluents are phenyl glycidyl ether, 4-vinylcyclohexene dioxide, limonene dioxide, 1,2-cyclohexene oxide, glycidyl acrylate, glycidyl methacrylate, styrene oxide, allyl glycidyl ether, etc., which may be added as viscosity modifying agents.

Epoxy resins also can include polymeric materials containing terminal or pendant epoxy groups. For example epoxy resins can be vinyl copolymers containing glycidyl acrylate or methacrylate as one of the comonomers. Other classes of curable epoxy containing polymers which can be used in the practice of the invention are epoxy-siloxane resins, epoxy-polyurethanes and epoxy-polyesters. Such polymers usually have epoxy functional groups at the ends of their chains. Epoxy-siloxane resins and method for making are more particularly shown by E. P. Plueddemann and G. Fanger, J. Am. Chem. Soc. 80,632-5(1959). As described in the literature, epoxy resins can also be modified in a number of standard ways such as by reaction with amines, carboxylic acids, thiols, phenols, alcohols, etc., as shown in U.S. Pat. Nos. 2,935,488; 3,235,620; 3,369,055; 3,379,653; 3,398,211; 3,403,199; 3,563,850; 3,567,797; 3,677,995; etc. Further examples of epoxy resins which can be used are shown in the Encyclopedia of Polymer Science and Technology, Vol 6, 1967, Interscience Publishers, New York, pp 209-271.

Epoxides such as α-olefin oxides also can be employed in the practice of the present invention. There are included, for example,

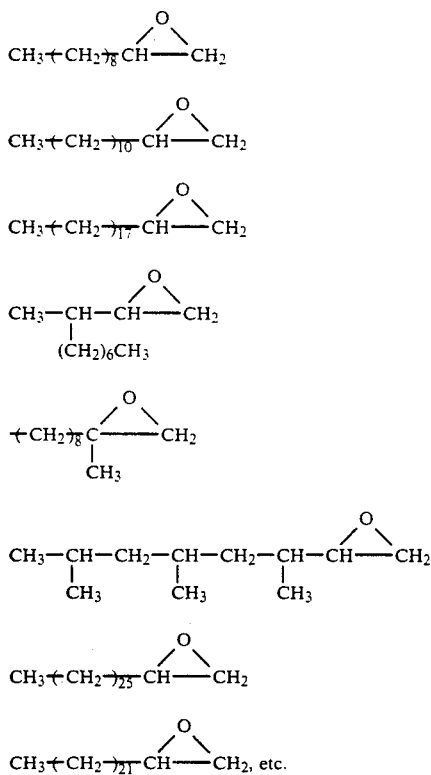

Arylonium salts useful in the practice of the invention are preferably diaryliodonium hexafluoroantimonate salts. The diaryliodonium salts which are particularly preferred are compounds included within the formula, $$[R^3IR^4]^+[SbF_6]^-, \quad (4)$$

where $R^3$ and $R^4$ are selected from the same or different $C_{(6-14)}$ monovalent aromatic hydrocarbon radicals substituted with one or more radicals substantially inert under condensation conditions.

Many of the preferred salts of formula (4) are the non-toxic diaryliodonium salts having $R^3$ or $R^4$ radicals substituted with $C_{(8-18)}$ alkoxy radicals shown by Crivello et al, Ser. No. 171,063, filed Mar. 21, 1988, which is incorporated herein by reference.

The diaryliodonium antimonate salts of the present invention also can include polymeric diaryliodonium salts comprising at least 0.01 mol percent of chemically combined divalent units selected from

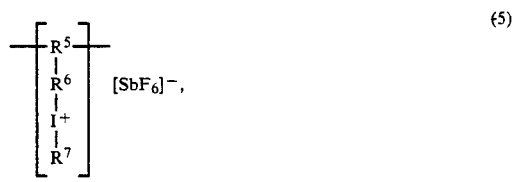

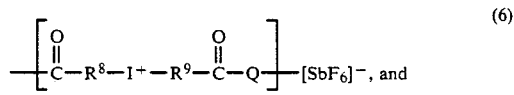

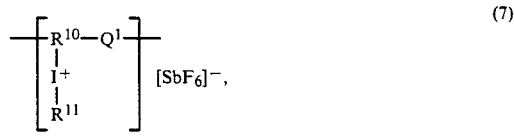

where $R^5$ is a trivalent $C_{(2-8)}$ alkylene or branched alkylene group, which can be substituted with one or more radicals inert during condensation, $R^6$, $R^8$ and $R^9$ are selected from $C_{(6-14)}$ divalent arylene groups which can be substituted with one or more radicals inert during condensation, $R^{10}$ is selected from trivalent $C_{(6-14)}$ aryl groups which can be substituted with one or more radicals inert during condensation, $R^7$ and $R^{11}$ are $C_{(6-14)}$ monovalent aryl radicals which can be substituted with one or more radicals inert during condensation, Q is an ester or amide linkage and $Q^1$ is methylene or —O—, and when $Q^1$ is methylene, $R^{10}$ is substituted with —$OR^{12}$, where $R^{12}$ is a $C_{(1-14)}$ monovalent hydrocarbon group, or a monovalent hydrocarbon group substituted with one or more radicals inert during condensation.

Diaryliodonium antimonate salts which are included within formula (4) are, for example,

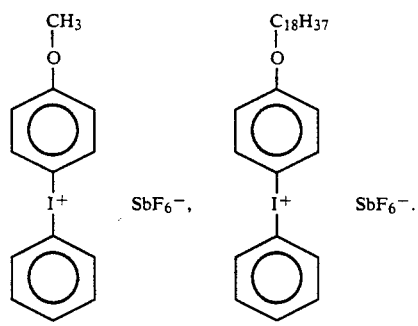

Among the polymeric diaryliodonium salts having chemically combined units of formula (5), there are included

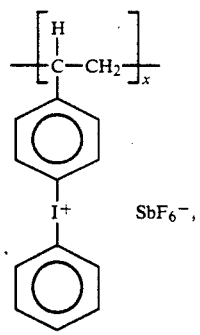

where x is an integer having a value of at least 5.

The preferred polymeric diaryliodonium salts shown by formulas (5) and (7) are for example,

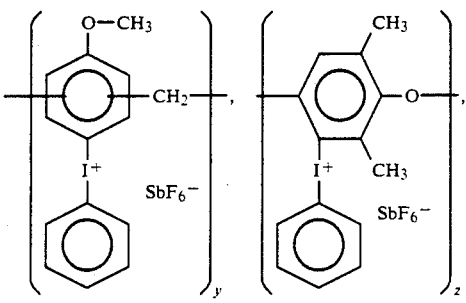

where y and z are integers having a value of at least 5.

Monovalent aromatic hydrocarbon radicals which are included within $R^3$, $R^4$, $R^7$ and $R^{11}$ are, for example, phenyl, tolyl, xylyl, naphthyl, anthryl; $C_{(1-18)}$ alkoxy substituted $C_{(6-14)}$ aromatic organic radicals such as methoxy substituted phenyl and octyloxy substituted tolyl also are included. Monovalent alkylene radicals included within $R^5$ are, for example, ethylidene and propylidene. Radicals included within $R^6$, $R^8$, and $R^9$ are divalent aromatic radicals such as phenylene, tolylene, xylylene and naphthylene. Radicals included within $R^{10}$ are for example,

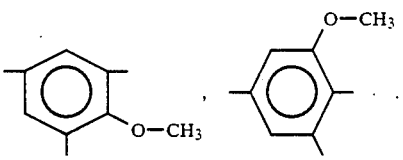

Aromatic free-radical generating compounds which can be used as cocatalysts in combination with the arylonium salts are, for example, aromatic pinacols, such as benzopinacol which is preferred. In addition, other free-radical aromatic generating compounds can be used, such as benzoin alkyl ethers, e.g.

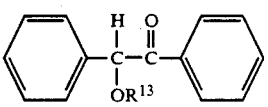

where $R^{13}$ is a $C_{(1-14)}$ organic radical selected from $C_{(1-14)}$ alkyl radicals, and $C_{(6-14)}$ aryl radicals; high temperature Organic peroxides having half-lives at 100° C. of about 10 hours and about 1 minute at temperatures of about 150° C. to 200° C., such as dicumyl peroxide, a a'-bis(t-butylperoxy) diisopropylbenzene, t-butyl perbenzoate; silyl ethers of aromatic pinacols and diaryl disulfides, such as diphenyl disulfide, also are effective.

A catalytic amount of arylonium salt is that amount of arylonium salt sufficient to provide from about 0.01 to 100 mg of antimony, per gram of epoxy resin. An effective amount of the free-radical generating cocatalyst which can be used as a cocatalyst in combination with the arylonium salt is from 0.01 to 3 parts by weight of the free-radical precursor compound, and preferably 0.3 to 0.8 part, per part of arylonium salt.

In the practice of the invention for making the dielectric materials, the order of the addition of the various ingredients is not critical. One procedure is to initially blend the free radical generating compound with the arylonium salt and then further blending the resulting mixture with the silicone polyimide and the epoxy resin.

In order that those skilled in the art will be better able to practice the present invention the following example is given by way of illustration and not by way of limitation. All parts are by weight unless otherwise indicated.

EXAMPLE 1

A heat curable dielectric material is made by blending 645 g of a solution of a polyimidesiloxane which is made by effecting a reaction in 2-methoxyethylether/toluene solvent between (0.05 moles) of a polydimethylsiloxane having an average of about 8.4 dimethylsiloxy units and terminal 3-amino-N-propyl groups, (0.170 moles) of 2,2-bis[4-(3,4 dicarboxyphenoxy)phenyl]-propane dianhydride and (0.119 moles) of 2,4-toluene diamino (36% solids) with 250 g of CY-179 which is 3,4-epoxycyclohexylmethyl-3,4-epoxycyclohexylcarboxylate available from Ciba Geigy, Hawthorne, N.Y. To the resulting mixture, there is added 2.5 g of a diphenyliodonium-hexafluoro-antimonate salt which has one of its phenyl groups substituted with an octyloxy radical and 2.5 g of benzopinacol.

The above procedure is repeated except that in place of the benzopinacol, there is substituted 0.06 g of copper naphthenate in an aliphatic hydrocarbon oil. The copper naphthenate is obtained from Moony Chemical Co., Cleveland, Ohio. Another curable mixture is prepared wherein 0.25 g of copper naphthenate is used.

Wet films of approximately 120 mg are cast on 2×2" slides from the respective heat curable mixtures. The solvent is evaporated and the heat curable dielectric mixtures are cured by heating on a hot plate at 100° C. for 10 minutes, 150° C. for 20 minutes and 200° C. for 40 minutes. The resulting films are clear and approximately 15μ thick. From measurements of weight loss occurring during cure, the epoxy content of each film can be determined. It is found that the film obtained from the heat curable dielectric mixture containing 0.06 g of the copper naphthenate has approximately 24% by weight of the epoxy resin in the cured film. The heat curable dielectric mixture having 0.25 g of copper naphthenate shows 35% by weight of epoxy resin in the cured film. However, the film obtained from the heat curable composition containing the 2.5 g of benzopinacol has 37% of epoxy resin remaining in the cured film. These results indicate that substantially equivalent results are obtained with respect to % cure of the epoxy resin in the cured film when 0.25 g of copper naphthenate is used as a cocatalyst for the diphenylhexafluoroantimonate iodonium salt as compared to the 2.5 g of the benzopinacol as a cocatalyst. However, it is found that even though the copper naphthenate provides a cured film approximately equivalent to the film obtained using the benzopinocal cocatalyst, the solution shelf life of the copper naphthenate heat curable dielectric composition is less than a month under ambient conditions, while the mixture containing the benzopinocal cocatalyst has a solution shelf life of greater than 6 months under ambient conditions. An improvement in solution shelf life is obtained when the copper naphthenate concentration is reduced, but an unacceptable loss in weight % loss in epoxy resin results in the cured film. The use of the benzopinacol in place of the copper naphthenate also eliminates the problem of an undesirable two-phase mixture as a result of the separation of the aliphatic hydrocarbon oil used as a carrier for the copper naphthenate. The films cast from the dielectric material containing the benzopinacol in combination with the diphenylhexafluoroantimonate iodonium salt cocatalyst also are found to be clear and show single $T_g$ values.

Although the above example is directed to only a few of the very many variables which can be used in making the heat curable dielectric materials of the present invention, it should be understood that the present invention is directed to a much broader variety of heat curable dielectric materials as set forth in the description preceding this example.

What is claimed is:

1. A heat curable dielectric material useful in the formation of multilayer conductor structures comprising by weight,
    (A) 100 parts of a silicone polyimide,
    (B) 10 to 150 parts of an epoxy resin,
    (C) a catalytic amount of an arylonium salt,
    (D) an effective amount of a free radical generating aromatic compound as a cocatalyst for (C).

2. A heat curable dielectric material in accordance with claim 1, where the free radical generating aromatic compound is benzopinacol.

3. A heat curable dielectric material in accordance with claim 1, where the silicon polyimide is a reaction product of an aromatic bis(ether anhydride) and a amino-organo-terminated organosiloxane.

4. A heat curable dielectric material in accordance with claim 1, where the arylonium salt is an octyloxy substituted diphenyliodonium hexafluoroantimonate.

5. A heat curable dielectric material in accordance with claim 3, where the aromatic bis(ether anhydride) is 2,2-bis[4-(3,4-dicarboxyphenoxy)phenyl] propane dianhydride.

* * * * *